US008566776B2

(12) United States Patent
Qiu

(10) Patent No.: US 8,566,776 B2
(45) Date of Patent: *Oct. 22, 2013

(54) METHOD TO AUTOMATICALLY ADD POWER LINE IN CHANNEL BETWEEN MACROS

(75) Inventor: Li Qiu, Palo Alto, CA (US)

(73) Assignee: QUALCOMM Incorporated, San Diego, CA (US)

( * ) Notice: Subject to any disclaimer, the term of this patent is extended or adjusted under 35 U.S.C. 154(b) by 681 days.

This patent is subject to a terminal disclaimer.

(21) Appl. No.: 12/270,475

(22) Filed: Nov. 13, 2008

(65) Prior Publication Data

US 2010/0122230 A1    May 13, 2010

(51) Int. Cl.
    *G06F 17/50*    (2006.01)
    *G06F 9/455*    (2006.01)

(52) U.S. Cl.
    USPC ........... 716/139; 716/100; 716/101; 716/102; 716/109; 716/114; 716/115; 716/118; 716/119; 716/120; 716/126; 716/127; 716/133; 716/134; 703/13; 703/14

(58) Field of Classification Search
    USPC ......... 716/100–102, 109, 114–115, 118–120, 716/126–127, 133–134, 139, 13–14
    See application file for complete search history.

(56) References Cited

U.S. PATENT DOCUMENTS

| 6,487,706 | B1 | 11/2002 | Barkley |
| 6,609,240 | B2 * | 8/2003 | Baba ............................. 716/113 |
| 6,622,294 | B2 * | 9/2003 | Saxena et al. ................. 716/127 |
| 6,925,627 | B1 | 8/2005 | Longway |
| 7,603,641 | B2 * | 10/2009 | Lin ............................... 716/120 |
| 2004/0145033 | A1 | 7/2004 | McElvain |
| 2006/0056219 | A1 * | 3/2006 | Araki et al. ..................... 365/63 |
| 2006/0085778 | A1 * | 4/2006 | Keinert et al. ..................... 716/9 |
| 2008/0111211 | A1 | 5/2008 | Nair |
| 2009/0166883 | A1 * | 7/2009 | Nishimura .................... 257/774 |

FOREIGN PATENT DOCUMENTS

TW    I301301 B    9/2008

OTHER PUBLICATIONS

International Partial Search Report—PCT/US2009/063967—International Search Authority—European Patent Office, Apr. 7, 2010.
International Search Report—PCT/ US2009/063967, International Search Authority—European Patent Office Jun. 2, 2010.
Written Opinion—PCT/ US2009/063967, International Search Authority—European Patent Office Jun. 2, 2010.
Taiwan Search Report—TW098138712—TIPO—Jun. 3, 2013.

* cited by examiner

*Primary Examiner* — Nghia Doan
(74) *Attorney, Agent, or Firm* — Sam Talpalatsky; Nicholas J. Pauley; Joseph Agusta

(57) ABSTRACT

In a particular embodiment, a method is disclosed that includes automatically adding a first power line in a channel between at least two macros when less than two system power supply lines with opposite polarities are detected within the channel.

27 Claims, 16 Drawing Sheets

METHOD TO AUTOMATICALLY ADD POWER LINE IN CHANNEL BETWEEN MACROS

FIELD OF THE DISCLOSURE

The present disclosure is generally directed to a method to automatically add at least one power line with proper polarity or at least two power lines with opposite polarities in a channel between at least two macros.

BACKGROUND

Complex application-specific integrated circuit (ASIC) and/or a system on a chip (SoC) designs use large numbers of hard macro cells, such as memory cells and/or mixed-signal devices. The macros are generally placed in clusters due to timing and/or physical constraints. The clustering of hard macro cells can be so large that signal delay on wire connections to, from and/or through the macro cell clusters becomes of concern for ASIC/SoC performance. Gaps between pairs of macro cells may be defined as channels when the gaps are smaller than certain threshold values. Buffering in the channels is an efficient way to speed up signals on wire connections. To enable buffering, the power grid integrity in the channels should be guaranteed. The power grid integrity in a channel may mean that there should be at least two power supply lines with opposite polarities (one power line and one ground line) existing in that channel. Typically, the size of the channels (width for vertical channels or height for horizontal channels) between the macro cells is not large enough to satisfy the power grid integrity requirement.

One conventional solution is to allocate larger channels to allow at least two power lines with opposite polarities to be present in the channels. However, this may lower the macro device placement density and therefore increase the size of the die chip, which increases the cost of the final products. Another conventional solution is to manually patch individual channels that are intended to be used. However, manual patching is a time-consuming, tedious and error-prone process, and the results may not be consistently repeatable.

SUMMARY

In a particular embodiment, a method is disclosed that includes automatically adding a first power line with proper polarity in a channel between at least two macros when less than two system power supply lines with opposite polarities are detected within the channel, which presents a power grid integrity issue.

In another embodiment, a method is disclosed that includes checking macros in an integrated circuit design for channels between respective macros. The method also includes detecting any power grid integrity issues within the channels, and automatically patching the power grid integrity issue within at least one channel that lacks the power grid integrity.

In another embodiment, an automated circuit design tool is disclosed. The automated circuit design tool comprises a processor-readable medium having processor instructions that are executable to cause a processor to: scan a circuit to detect channels at a right side of a macro and at a top of the macro in the circuit, determine the number and polarity of system power supply lines in the channels, and automatically add a power line with proper polarity in at least one channel where there are less than two system power supply lines with opposite polarities. The method may not be limited to the right and the top sides of the macro cells. For example, the left and the bottom sides of the macro cells may also be used.

In another embodiment, a computer-readable medium tangibly embodying computer-readable data comprising a data file that represents a circuit designed using an automated circuit design tool is disclosed. The circuit includes a channel between at least two macros. The circuit also includes an additional first power line or two additional power lines that are automatically added in the channel when less than two system power supply lines with opposite polarities are disposed within the channel.

In another embodiment, a circuit designed using an automated circuit design tool is disclosed. The circuit includes a first vertical channel between a first pair of macros with a first patch disposed in the first vertical channel, the first patch including at most one additional power line with proper polarity automatically added to the first vertical channel. The circuit also includes a second vertical channel between a second pair of macros with a second patch disposed in the second vertical channel, the second patch including two additional power lines with opposite polarities automatically added to the second vertical channel. The circuit further includes a first horizontal channel between a third pair of macros with a third patch disposed in the first horizontal channel, the third patch including at most one additional power line with proper polarity automatically added to the first horizontal channel. The circuit also includes a second horizontal channel between a fourth pair of macros with a fourth patch disposed in the second horizontal channel, the fourth patch including two additional power lines with opposite polarities automatically added to the second horizontal channel.

One particular advantage provided by the disclosed embodiments is that the power grid integrity in channels to enable buffering in the channels can be accomplished by an automated design tool within regular machine run time.

Another advantage provided by the disclosed embodiments is that the automated design can be repeated with the same results consistently.

Other aspects, advantages, and features of the present disclosure will become apparent after review of the entire application, including the following sections: Brief Description of the Drawings, Detailed Description, and the Claims.

DETAILED DESCRIPTION

Figure 1:
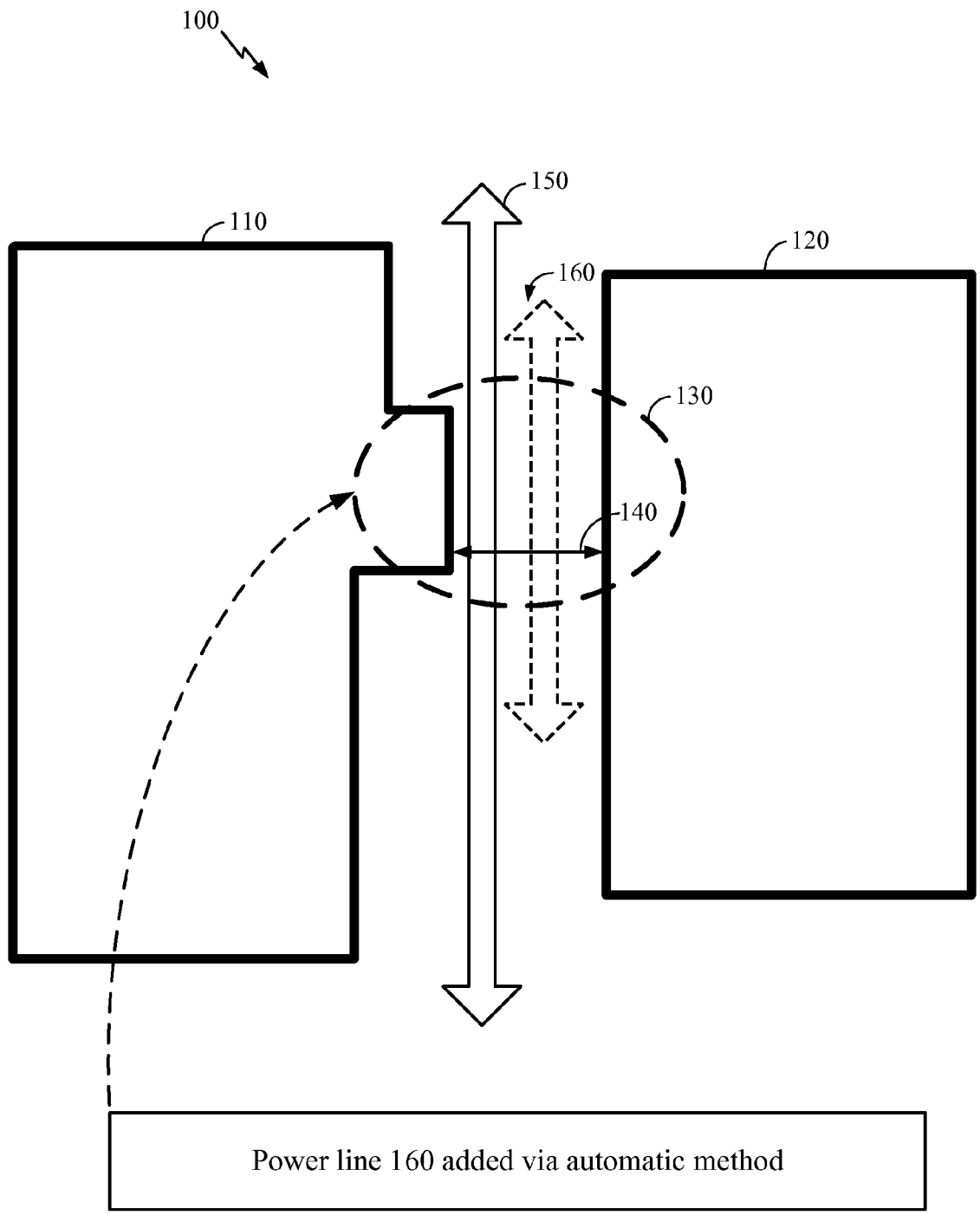
FIG. 1 is a diagram of a particular illustrative embodiment of a system having a power line with proper polarity added in a channel via an automatic method.

Referring to FIG. 1, a diagram of a particular illustrative embodiment of a system having a power line added in a channel via an automatic method is depicted and generally designated 100. A first macro 110 may be disposed in a circuit adjacent a second macro 120. In a particular embodiment, the first macro 110 and the second macro 120 may be memory cells, mixed-signal devices, any other components of an application-specific integrated circuit (ASIC), a system on a chip (SoC), or any combination thereof. A channel 130 may be defined between the first macro 110 and the second macro 120 whenever a shortest distance 140 between the first macro 110 and the second macro 120 is below a threshold value. In a particular embodiment, the threshold value may be smaller than the pitch between adjacent system power supply lines with opposite polarities in the power grid. A system power supply line 150 may be disposed within the channel 130. A first power line 160 with a polarity opposite to the system power supply line 150 may be automatically added in the channel 130 when less than two system power supply lines 150 with opposite polarities are detected within the channel 130 using a method to automatically add a power line to a channel, such as will be discussed with respect to FIGS. 6 and 9-12.

The method may include automatically detecting the number of power supply lines in the channel 130, the polarities of the power supply lines in the channel, and then adding the first power line 160 with proper polarity in the channel 130 between at least two macros 110, 120 when less than two system power supply lines 150 with opposite polarities are detected within the channel 130. As used herein, "opposite" polarities indicate different voltages that are applied to the power supply lines. As illustrative, non-limiting examples, a positive voltage may be opposite to a ground voltage, a negative voltage may be opposite to a ground voltage, or a negative voltage may be opposite to a positive voltage, based on voltages that are used to power the ASIC/SoC. As used herein, a "proper" polarity of an automatically added line when a line is detected in the channel (such as the line 150) is a polarity opposite to the polarity of the detected line. A "proper" polarity of an automatically added line when no lines are detected in the channel (such as will be discussed with respect to FIG. 3) is an opposite polarity to another line that is automatically added to the channel so that the two added lines have opposite polarities. The method may be implemented in circuit design software, automated design software, a circuit design tool, an automated design tool, and the like.

By using an automatic method, the power grid integrity in channels to enable buffering in the channels can be accomplished by an automated design tool within regular machine run time. In addition, by using an automatic method, the automated design can be repeated with the same results consistently.

Figure 2:
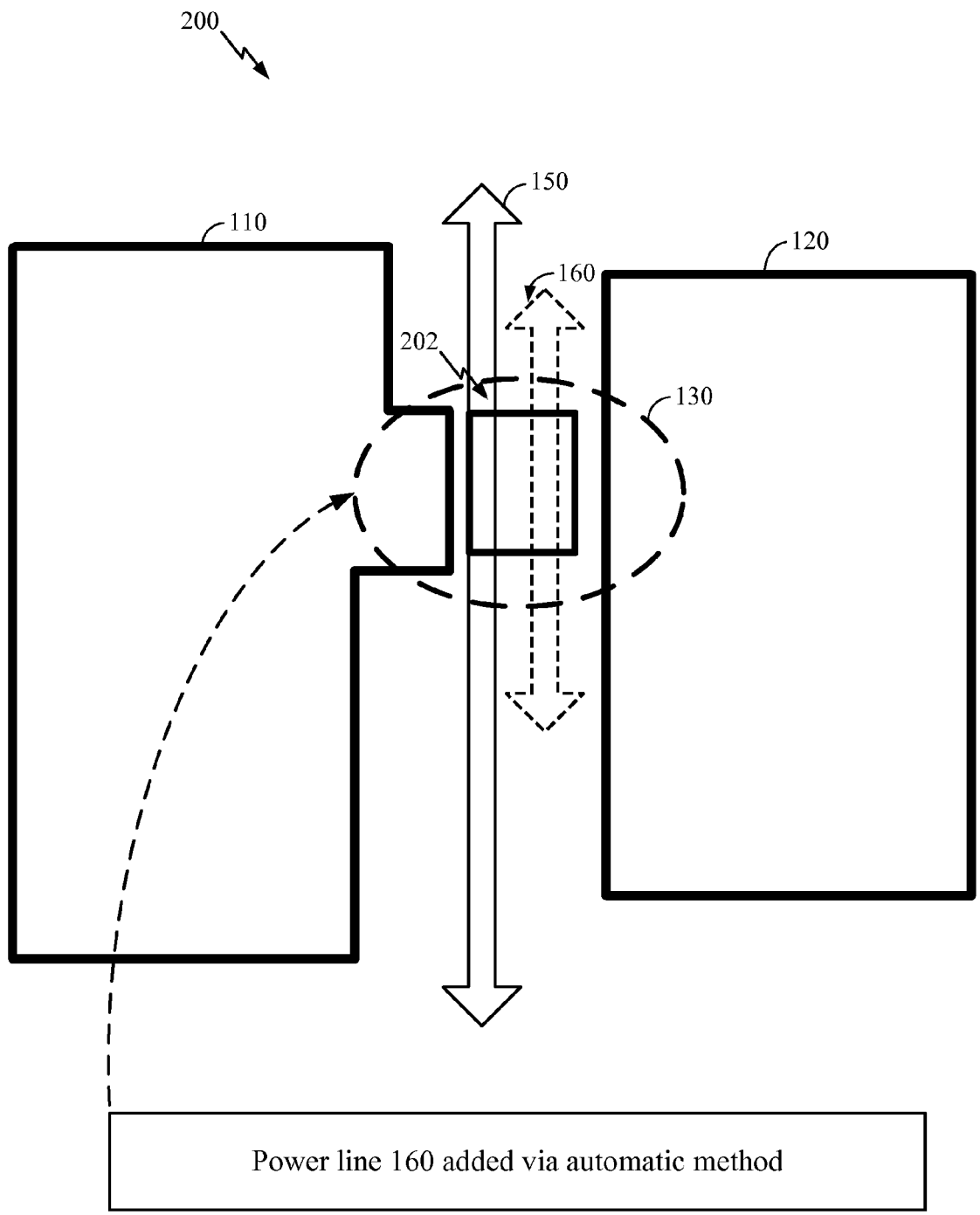
FIG. 2 is a diagram of a particular illustrative embodiment of a system having a power line with proper polarity added in a channel via an automatic method and a device in the channel.

Referring to FIG. 2, a diagram of a particular illustrative embodiment of a system having a power line added in a channel via an automatic method and a device in the channel is depicted and generally designated 200. A device 202 may be disposed in the channel 130 between the macros 110 and 120 and coupled to the system power supply line 150 and the first power line 160 in the channel 130. In a particular embodiment, the device 202 may be a decoupling capacitor, a substrate well connector, a buffer, or an inverter. The first power line 160 and the device 202 may be automatically added according to the automatic method, such as will be discussed with respect to FIGS. 6 and 9-12.

As depicted in the particular embodiments shown in FIG. 1 and FIG. 2, for example, at most the first power line 160 may be automatically added in the channel 130 when one system power supply line 150 is detected within the channel 130. The polarity of the first power line 160 should be opposite to that of the system power supply line 150 to satisfy the power grid integrity requirement. In the particular embodiments shown in FIG. 1 and FIG. 2, the first power line 160 will have a polarity opposite to a polarity of the one system power supply line 150 that is detected within the channel 130. For example, if the polarity of the system power supply line 150 is positive (power), the polarity of the first power line 160 may be chosen to be ground. Similarly, if the polarity of the system power supply line 150 is ground, the polarity of the first power line 160 may be chosen to be power (positive).

Figure 3:
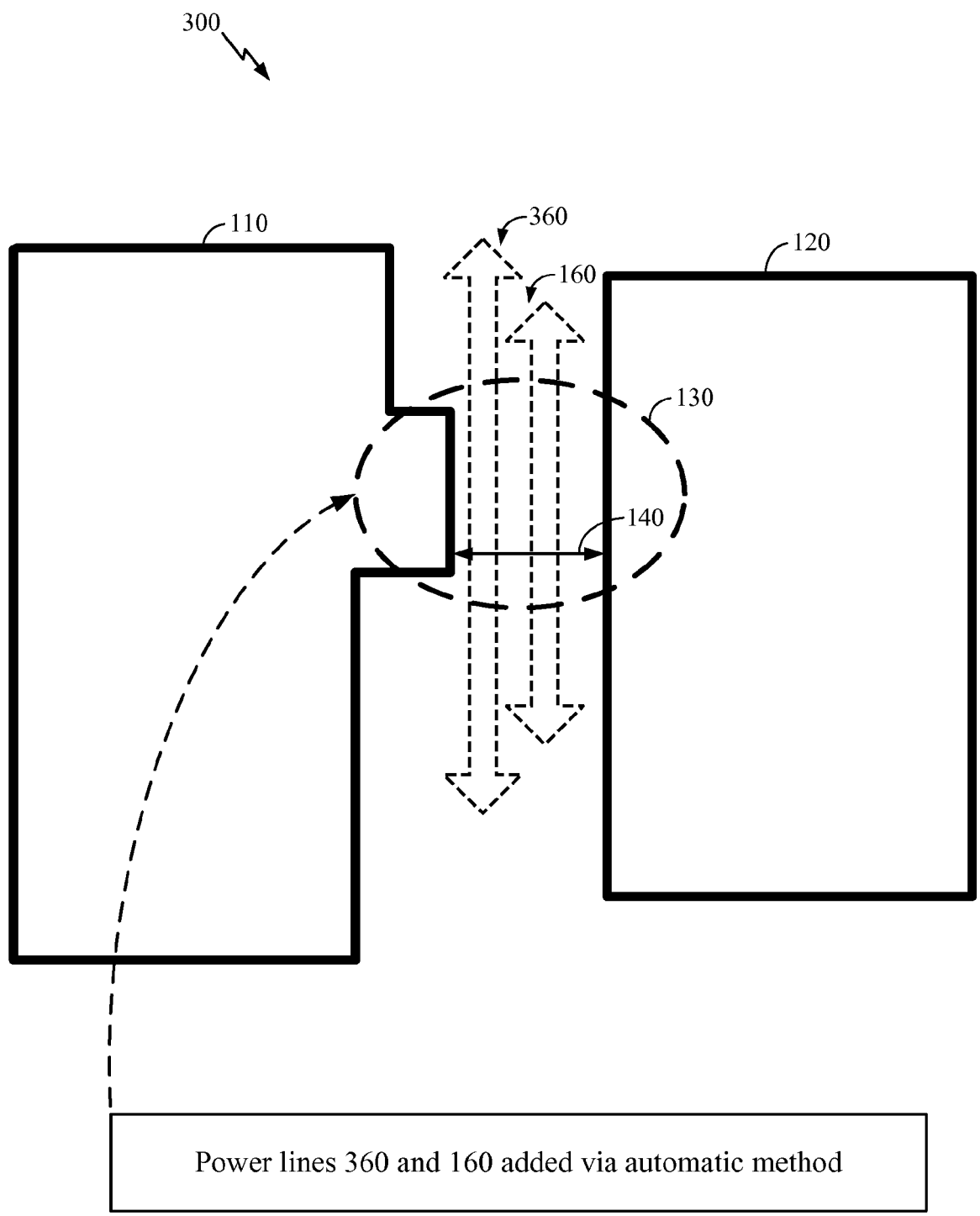
FIG. 3 is a diagram of a particular illustrative embodiment of a system having two power lines with opposite polarities added in a channel via an automatic method.

Referring to FIG. 3, a diagram of a particular illustrative embodiment of a system having two power lines with opposite polarities added in a channel via an automatic method is depicted and generally designated 300. A second power line 360 with polarity opposite to the polarity of the first power line 160 may automatically be added in the channel 130 when no system power supply lines are detected within the channel 130.

Figure 4A:
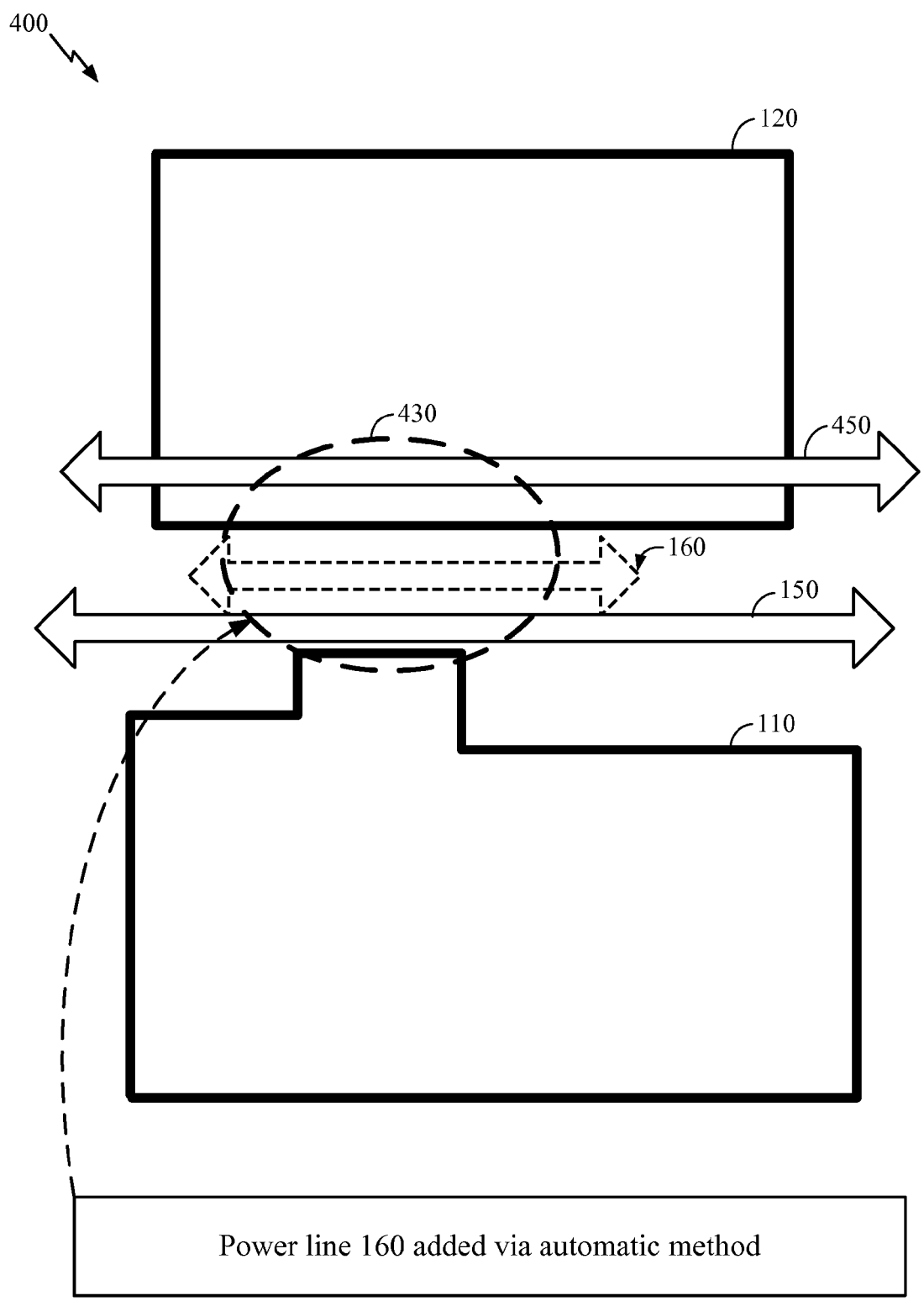
FIG. 4A is a diagram of a particular illustrative embodiment of a system having a power line with proper polarity added in a horizontal channel via an automatic method.
Figure 4B:
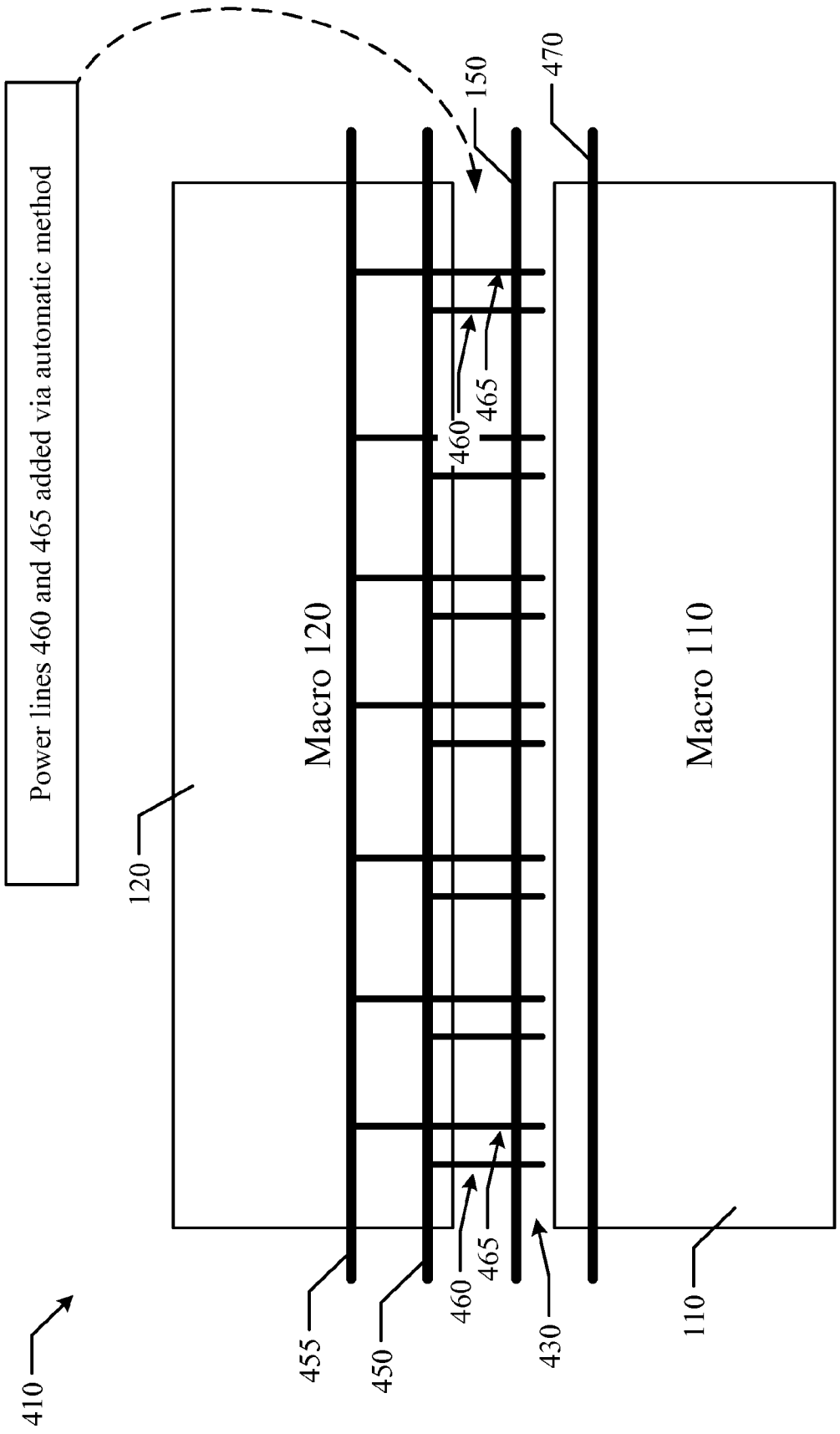
FIG. 4B is a diagram of a particular illustrative embodiment of a system having multiple power lines added in a configuration that is not parallel to a horizontal channel via an automatic method.

In a particular embodiment, the first power line 160 has the polarity opposite to the polarity of the second power line 360. For example, if the polarity of the first power line 160 is positive, the polarity of the second power line 360 will be chosen to be ground. Similarly, if the polarity of the first power line 160 is ground, the polarity of the second power line 360 will be chosen to be positive. FIGS. 4A and 4B depict alternative methods to automatically add a power line in a horizontal channel.

Referring to FIG. 4A, a diagram of a particular illustrative embodiment of a system having a power line added in a horizontal channel via an automatic method is depicted and generally designated 400. The system power supply line 150 may be disposed within the horizontal channel 430, and a system power supply line 450 having opposite polarity to the system power supply line 150 may be over a macro 120. The first power line 160 with a polarity opposite to the polarity of the system power supply line 150 may be automatically added in the horizontal channel 430 between at least two macros 110, 120 when less than two system power supply lines 150 with opposite polarities are detected within the horizontal channel 430 using a method to automatically add a power line to a channel.

In a particular embodiment, the method to automatically add a power line to a channel may duplicate the methods of FIGS. 1-3, as applied to horizontal channels. Although not shown in FIG. 4A, the method to automatically add a power line to a channel may also include adding a device disposed in the horizontal channel 430, similar to adding the device 202 in the vertical channel 130 between the macros 110 and 120, the device 202 coupled to the system power supply line 150 and the first power line 160 in the vertical channel 130, as shown in FIG. 2. Although not shown in FIG. 4A, the method to automatically add a power line to a channel may include automatically adding a second power line in the horizontal channel 430 when no system power supply lines are detected within the horizontal channel 430, similar to automatically adding the second power line 360 in the vertical channel 130 when no system power supply lines are detected within the vertical channel 130, as shown in FIG. 3.

Referring to FIG. 4B, a diagram of a particular illustrative embodiment of a system having multiple power lines added in a configuration that is not parallel to a horizontal channel via an automatic method is depicted and generally designated 410. The method to automatically add a power line to a channel may include automatically adding one or more additional power lines 460 that connect to a system power supply line 450 not in the channel 430, the system power supply line 450 having the same polarity as the additional power lines 460, the additional power lines 460 extending into the channel 430. Some other additional power lines 465 may also be automatically added that connect to another system power supply line 455 not in the channel 430, the system power supply line 455 having the same polarity as the additional power lines 465, the additional power lines 465 extending into the channel 430. The polarity of the system power supply line 450 and the additional power lines 460 is opposite to the polarity of the system power supply line 455 and the additional power lines 465. The additional power lines 460 and 465 may extend in a direction not parallel to the channel 430. In a particular embodiment, the system power supply lines 450 and 455 may be disposed above the macro 120. In a particular embodiment, the system power supply lines 450 and 455 may be substantially parallel to the other system power supply lines 150 and 470. The automatic method may further include detecting the system power supply lines 450 and 455 to find out their respective polarities and locations. The power grid integrity of the horizontal channel 430 may be accomplished with the additional power lines 460 and 465.

In general, a power line may be automatically added to a channel, such as in FIG. 1-3, 4A or 4B, after detecting the channel 130 or 430 between the at least two macros 110, 120 by determining that a shortest distance 140 between the at least two macros 110, 120 is at most a threshold value. In a particular embodiment, the threshold value may be smaller than the smallest value of the pitch between adjacent system power supply lines with opposite polarities in the power grid.

Figure 5:
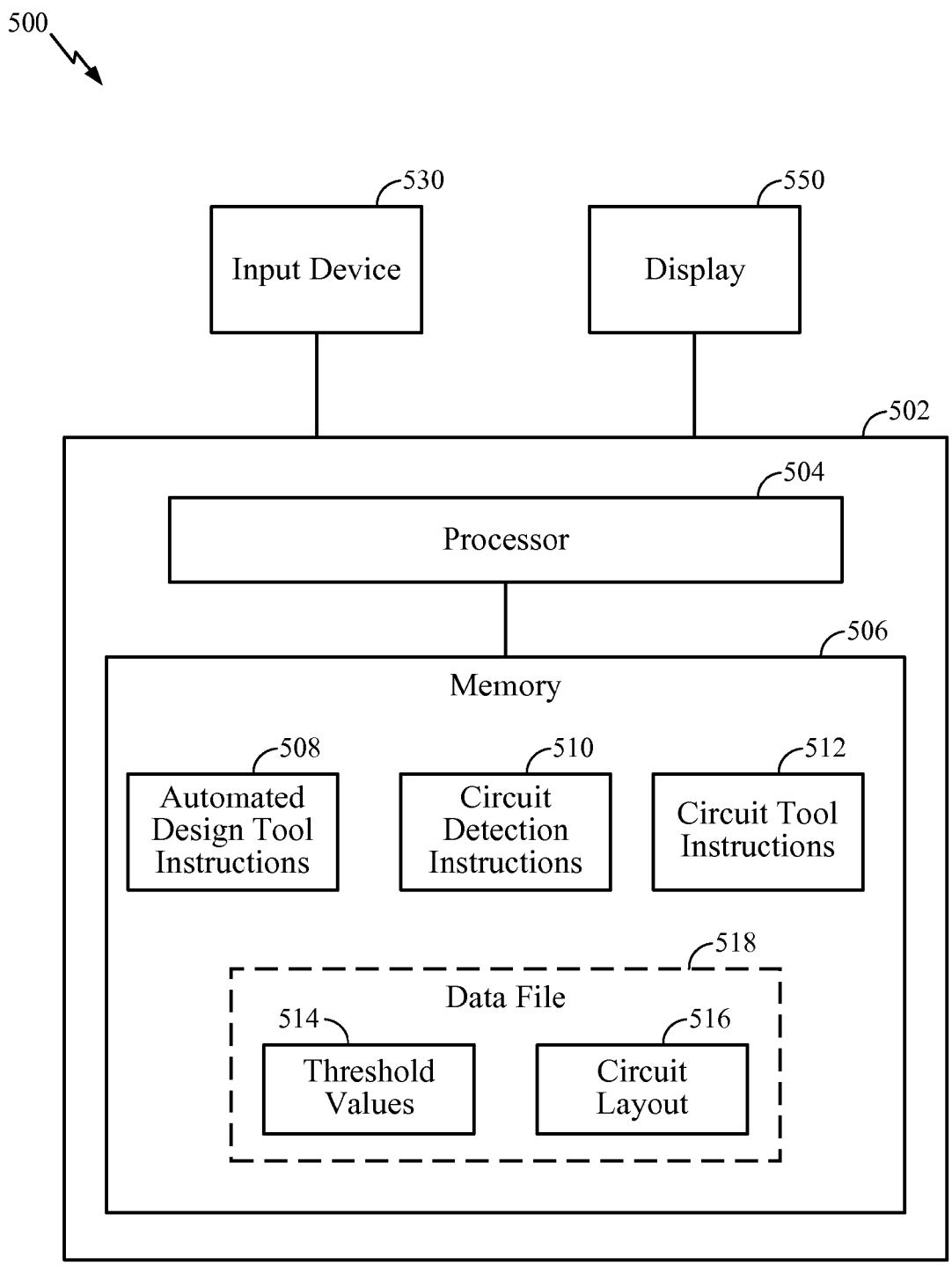
FIG. 5 is a diagram of a particular illustrative embodiment of a system to implement a method to automatically add a power line in a channel.

Referring to FIG. 5, a diagram of a particular illustrative embodiment of a system to implement a method to automatically add a power line in a channel is depicted and generally designated 500. The system 500 includes a device 502 that includes a processor 504 coupled to a memory 506. The memory 506 includes automated design tool instructions 508, circuit detection instructions 510, and circuit tool instructions 512. The memory also includes a data file 518. The data file 518 includes threshold values 514 and a circuit layout 516. The device 502 is coupled to an input device 530 and a display 550.

In operation, the processor 504 may be configured to access the circuit detection instructions 510, the threshold values 514, and the circuit layout 516 to detect whether there is a channel between at least two macros. If a channel is detected between a first macro and a second macro, the processor 504 may be configured to access the circuit detection instructions 510 and the circuit layout 516 to detect whether there are less than two system power supply lines with opposite polarities within the channel. If there are less than two system power supply lines with opposite polarities within the channel, the processor 504 may be configured to access the automated design tool instructions 508, the circuit tool instructions 512, and the circuit layout 516 to automatically add a first power line with proper polarity in the channel.

For example, the processor 504 may be configured to implement an automatic method to add the first power line 160 in the channel 130, 430 as illustrated in FIG. 1 and FIG. 4A. The processor 504 may also be configured to implement an automatic method to add the device 202 in the channel 130, as depicted in FIG. 2. When no system power supply lines are detected in the channel, the processor 504 may be configured to implement an automatic method to add the first power line 160 and the second power line 360 in the channel 130, as shown in FIG. 3. Similarly, the processor 504 may be configured to implement an automatic method to add the additional power line 460 to the system power supply line 450, where the additional power line 460 may extend in a direction not parallel to the channel 430, as illustrated in FIG. 4B.

Figure 6:
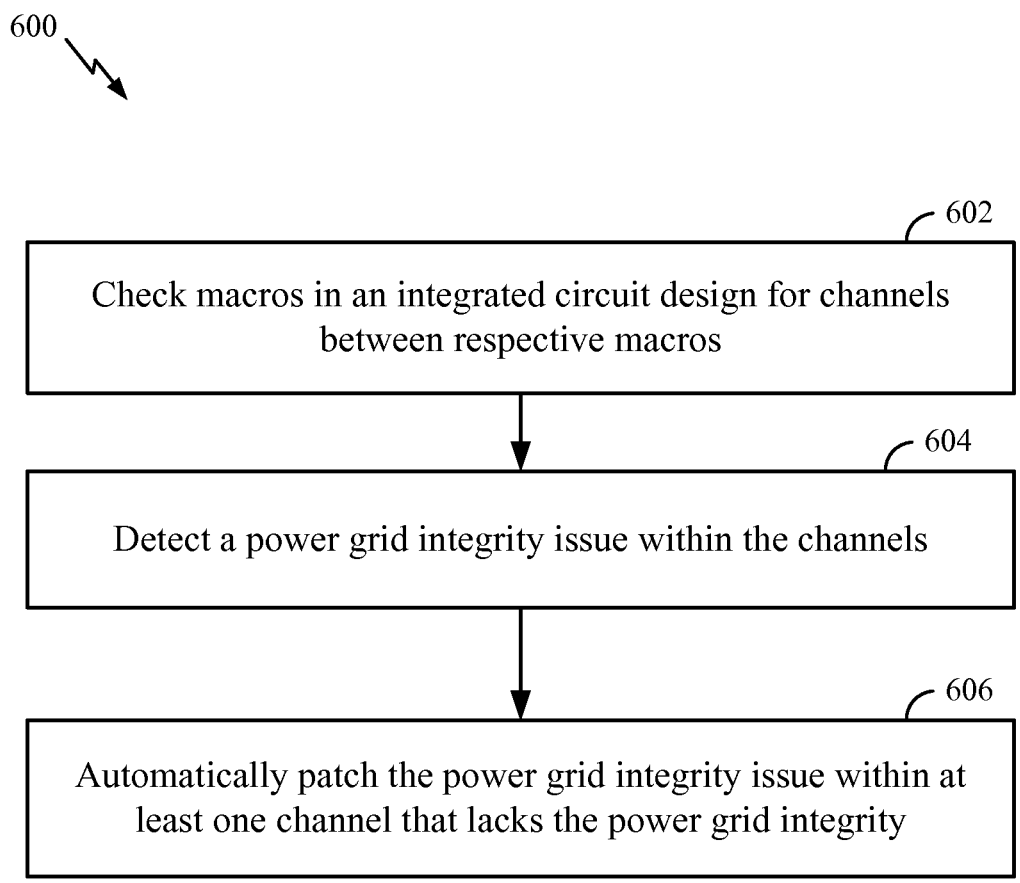
FIG. 6 is a flow diagram of a particular illustrative embodiment of a method to automatically patch a power grid integrity issue within at least one channel.

Referring to FIG. 6, a diagram of a particular illustrative embodiment of a method to automatically patch a power grid integrity issue within at least one channel is depicted and generally designated 600. The method 600 includes checking macros in an integrated circuit design for channels between respective macros, as indicated at 602. For example, the integrated circuit may include the macros 110 and 120 and the channel 130, as depicted in FIGS. 1-3. The method 600 includes detecting power grid integrity issues within the channels, as indicated at 604. For example, the system power supply line 150 may be detected within the channel 130, 430 as shown in FIGS. 1, 2, 4A, and 4B, or no system power supply lines may be detected within the channel 130, as depicted in FIG. 3. The method 600 includes automatically patching the power grid integrity issue within at least one channel that lacks the power grid integrity, as indicated at 606. For example, the first power line 160 with proper polarity may be automatically added in the channel 130, 430 as shown in FIGS. 1, 2, and 4A, or the first power line 160 and the second power line 360, which have opposite polarities, may be automatically added in the channel 130, as depicted in FIG. 3. Alternatively, one or more additional power lines 460, 465 with opposite polarities may be extended into the horizontal channel 430 in a direction that is not parallel to the horizontal channel 430 or the horizontal system power supply lines 150, 450, 455, 470, as shown in FIG. 4B, for example.

The method 600 may further include determining whether the at least one channel is a vertical channel, as in FIGS. 1-3, or a horizontal channel, as in FIGS. 4A and 4B. The method 600 may further include adding at least one of a tap cell and a decoupling capacitor cell in the at least one channel. For example, the device 202 may be added in the channel 130, as shown in FIG. 2. The method 600 may further include connecting a system power supply line disposed in an upper metal layer of the integrated circuit with an additional power line disposed in a lower metal layer of the integrated circuit, as will be discussed in further detail with respect to FIG. 7. The method 600 may further include connecting a system power supply line disposed in an upper metal layer of the integrated circuit with at least one additional power line disposed in a lower metal layer of the integrated circuit, as will be discussed in further detail with respect to FIG. 8. The method 600 may further include having at least one additional power line extend in a direction not parallel to a respective horizontal channel. For example, the additional power lines 460 and 465 may extend in a direction not parallel to the horizontal channel 430 shown in FIG. 4B.

Figure 7:
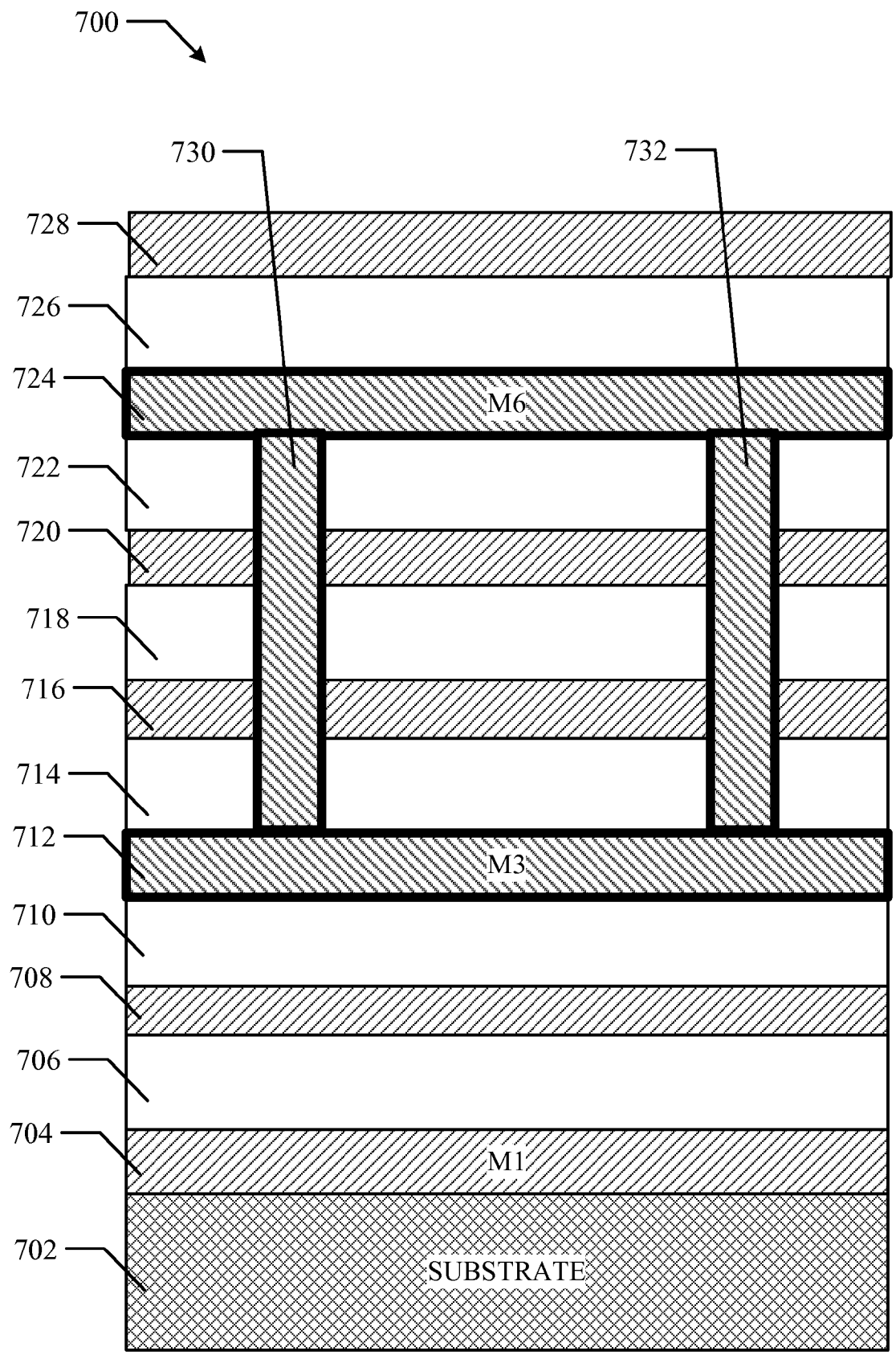
FIG. 7 is a diagram of a particular illustrative embodiment of automatically adding a power line in a vertical channel as well as in a horizontal channel.

Referring to FIG. 7, a diagram of a particular illustrative embodiment of automatically adding a power line in a vertical channel is depicted and generally designated 700. A substrate 702 of the integrated circuit has a lowest metal layer 704 disposed thereon, the lowest metal layer 704 being designated the metal-1 or M1 layer. A first dielectric insulating layer 706 is disposed on the lowest metal layer 704. A second metal layer 708 is disposed on the first dielectric insulating layer 706. A second dielectric insulating layer 710 is disposed on the second metal layer 708. A third metal layer 712 is disposed on the second dielectric insulating layer 710, the third metal layer 712 being designated the metal-3 or M3 layer. A third dielectric insulating layer 714 is disposed on the third metal layer 712. A fourth metal layer 716 is disposed on the third dielectric insulating layer 714. A fourth dielectric insulating layer 718 is disposed on the fourth metal layer 716. A fifth metal layer 720 is disposed on the fourth dielectric insulating layer 718. A fifth dielectric insulating layer 722 is disposed on the fifth metal layer 720. A sixth metal layer 724 is disposed on the fifth dielectric insulating layer 722, the sixth metal layer 724 being designated the metal-6 or M6 layer. A sixth dielectric insulating layer 726 is disposed on the sixth metal layer 724. A seventh metal layer 728 is disposed on the sixth dielectric insulating layer 726. In other illustrative embodiments, more alternating dielectric insulating and metal layers may be added.

As illustrated in FIG. 7, a connection between the M6 layer 724 and the M3 layer 712 may be made through conductive vias 730 and 732. The conductive vias 730 and 732 may be suitably insulated from the intervening metal layers 716 and 720. Automatically patching the power grid integrity issue for a vertical channel may further include connecting a system power supply line disposed in an upper metal layer of the integrated circuit, such as the M6 layer 724 shown in FIG. 7, with an additional power line 160 (FIG. 1) disposed in a lower metal layer of the integrated circuit, such as the M3 layer 712 shown in FIG. 7. In a particular embodiment, the conductive vias 730 and 732 may be used to connect a system power supply line disposed in an upper metal layer of the integrated circuit, such as the M6 layer 724 shown in FIG. 7, with an additional power line disposed in a lower metal layer of the integrated circuit, such as the M3 layer 712 shown in FIG. 7. The conductive vias 730 and 732 may be used to automatically patch the power grid integrity issue for the vertical channel.

The system power supply line 150 and the additional power lines 160 and 360 shown in FIGS. 1-3 may be disposed in a lower metal layer of the integrated circuit, such as the M3 layer 712 shown in FIG. 7, and may be connected through the conductive vias 730 and 732 to system power supply lines (not shown in FIGS. 1-3) disposed in an upper metal layer of the integrated circuit, such as the M6 layer 724 shown in FIG. 7.

The particular illustrative embodiment of automatically adding a power line in a vertical channel depicted and generally designated 700 is also applicable to the horizontal channel case, as shown in FIG. 4A. The system power supply line 150 and the additional power line 160 shown in FIG. 4A may be disposed in an upper metal layer of the integrated circuit, such as the M6 layer 724 shown in FIG. 7, and may be connected through the conductive vias 730 and 732 to a system power supply line (not shown in FIG. 4A) disposed in a lower metal layer of the integrated circuit, such as the M3 layer 712 shown in FIG. 7.

Figure 8:
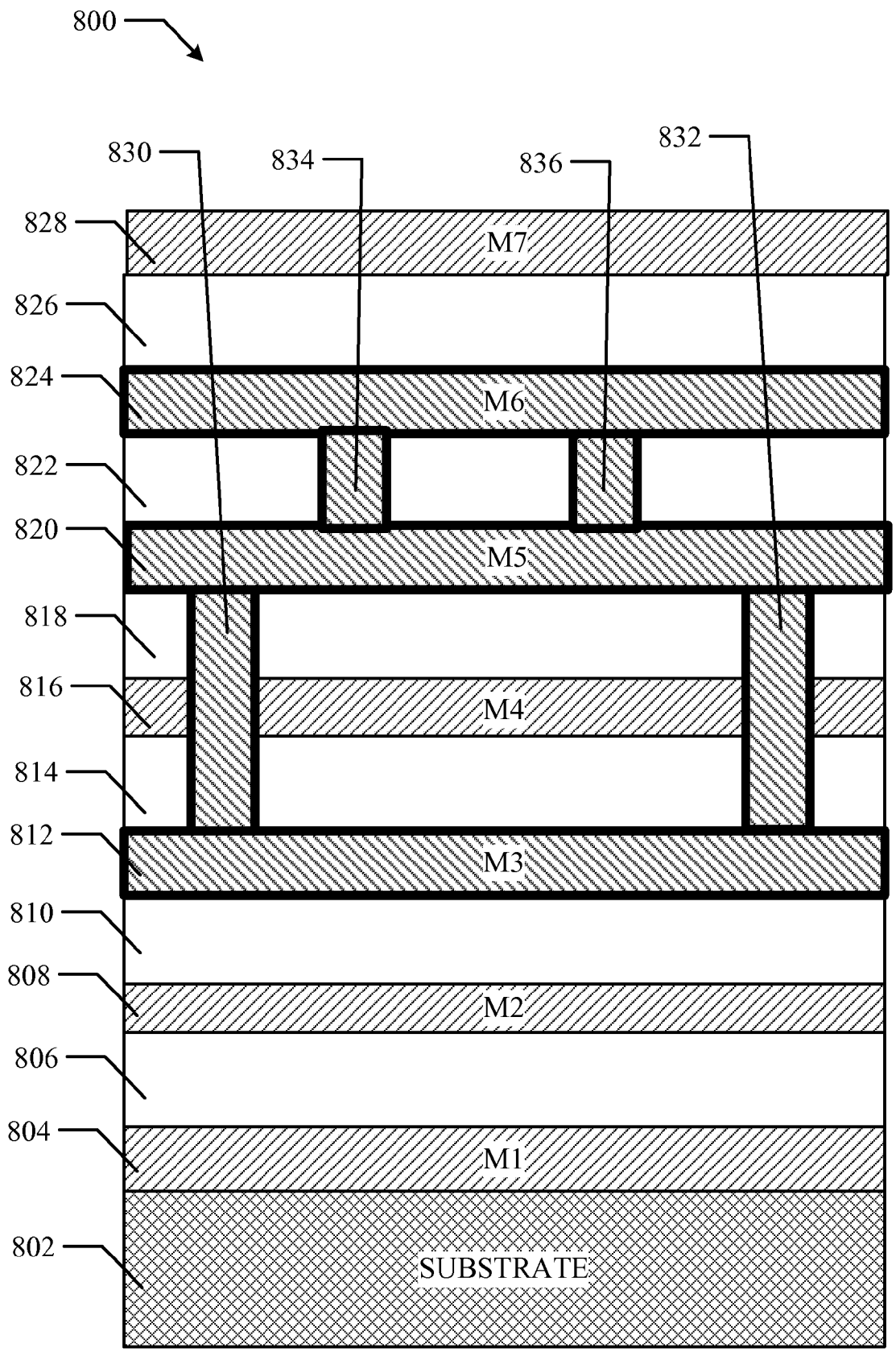
FIG. 8 is a diagram of a particular illustrative alternative embodiment of automatically adding a power line in a horizontal channel.

Referring to FIG. 8, a diagram of a particular illustrative alternative embodiment of automatically adding a power line in a horizontal channel is depicted and generally designated 800. A substrate 802 of an integrated circuit has a lowest metal layer 804 disposed thereon, the lowest metal layer 804 being designated the metal-1 or M1 layer. A first dielectric insulating layer 806 is disposed on the lowest metal layer 804. A second metal layer 808 is disposed on the first dielectric insulating layer 806. A second dielectric insulating layer 810 is disposed on the second metal layer 808. A third metal layer 812 is disposed on the second dielectric insulating layer 810, the third metal layer 812 being designated the metal-3 or M3 layer. A third dielectric insulating layer 814 is disposed on the third metal layer 812. A fourth metal layer 816 is disposed on the third dielectric insulating layer 814. A fourth dielectric insulating layer 818 is disposed on the fourth metal layer 816. A fifth metal layer 820 is disposed on the fourth dielectric insulating layer 818. A fifth dielectric insulating layer 822 is disposed on the fifth metal layer 820. A sixth metal layer 824 is disposed on the fifth dielectric insulating layer 822, the sixth metal layer 824 being designated the metal-6 or M6 layer. A sixth dielectric insulating layer 826 is disposed on the sixth metal layer 824. A seventh metal layer 828 is disposed on the sixth dielectric insulating layer 826, the seventh metal layer 828 being designated the metal-7 or M7 layer. In other illustrative embodiments, more alternating dielectric insulating and metal layers may be added.

In a particular embodiment, automatically patching the power grid integrity issue for a horizontal channel may further include connecting a system power supply line disposed in an upper metal layer of the integrated circuit, such as the M6 layer 824 shown in FIG. 8, with one or more additional power lines 460 (FIG. 4B) disposed in a lower metal layer of the integrated circuit, such as the M5 layer 820 shown in FIG. 8. The connection between the M6 layer 824 and the M5 layer 820 may be made through one or more conductive vias like conductive vias 834 and 836, as shown in FIG. 8, for example. At least one additional power line 460 disposed in the lower metal layer, such as the M5 layer 820, may extend in a direction not parallel to a respective horizontal channel, as shown by the additional power lines 460, 465 in FIG. 4B. The additional power lines 460, 465 disposed in the M5 layer 820 may be further connected to an even lower metal layer, such as the M3 layer 812, through other conductive vias 830 and 832. The conductive vias 830 and 832 may be suitably insulated from the intervening M4 layer 816.

Figure 9:
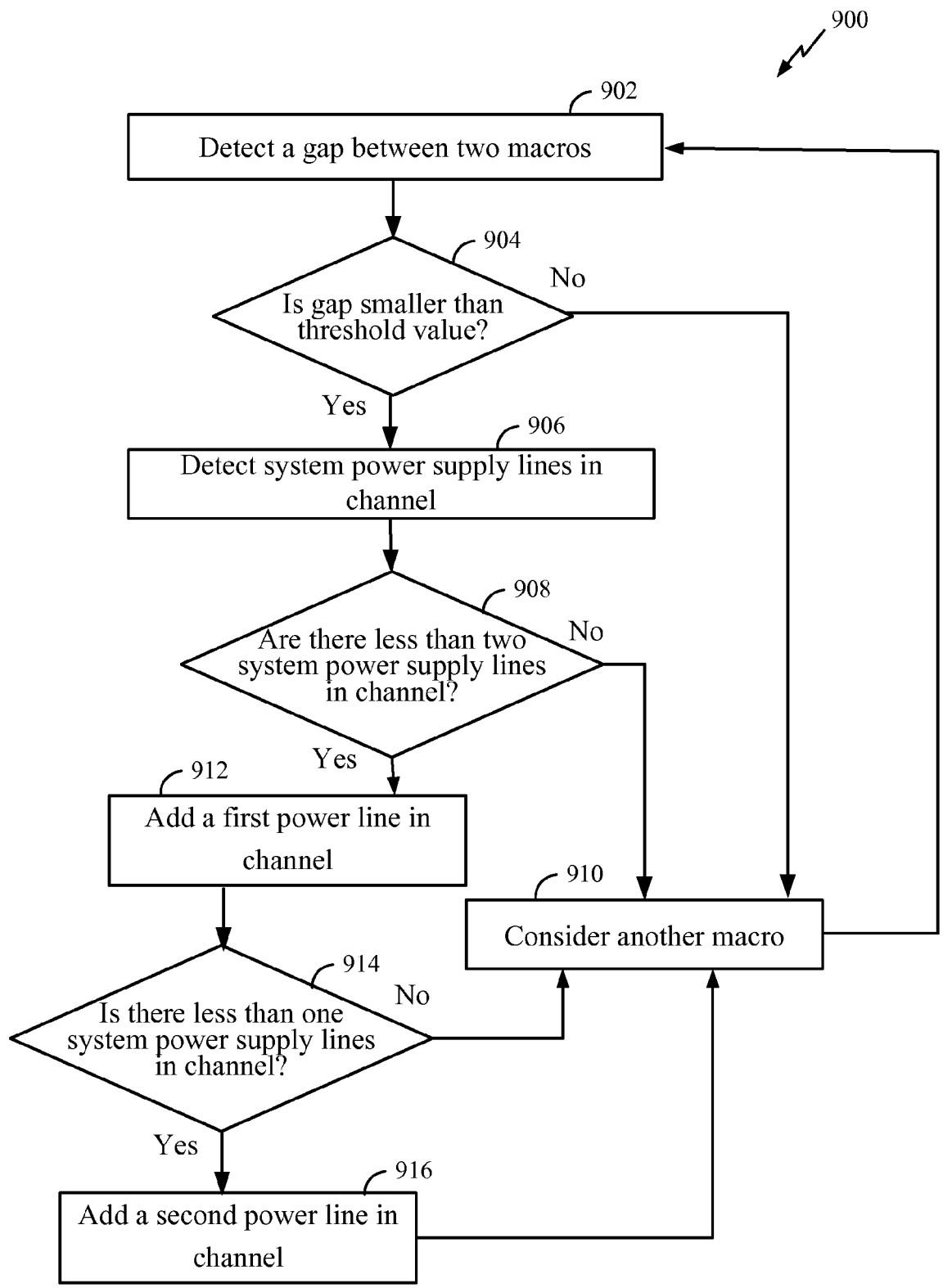
FIG. 9 is a flow diagram of a particular illustrative embodiment of a method to automatically add a power line in a channel.

Referring to FIG. 9, a flow diagram of a particular illustrative embodiment of a method to automatically add a power line in a channel is depicted and generally designated 900. The method 900 includes detecting a gap between two macros, such as the macros 110 and 120 of FIG. 1, as indicated at 902. The method 900 includes determining whether the gap is smaller than a threshold value, as indicated at 904. If the gap is not smaller than a threshold value, then another macro is considered, as indicated at 910. If the gap is smaller than a threshold value, then a channel, such as the channel 130 of FIGS. 1-4A, has been detected. The method 900 includes detecting system power supply lines and their polarities, such as the system power supply line 150 of FIGS. 1-4A, in the channel, as indicated at 906. The method 900 includes determining whether there are less than two system power supply lines with opposite polarities in the channel, as indicated at 908. If there are not less than two system power supply lines with opposite polarities in the channel, then another macro is considered, as indicated at 910. If there are less than two system power supply lines 150 with opposite polarities in the channel 130, then a first power line 160 with proper polarity should be added to the channel 130. The method 900 includes adding the first power line in the channel automatically, as indicated at 912.

The method 900 includes determining whether there is less than one system power supply line in the channel, as indicated at 914. If there is not less than one system power supply line in the channel, then another macro is considered, as indicated at 910. If there is less than one system power supply line 150 in the channel 130, then a second power line 360 with a polarity opposite to the polarity of the first power line 160 should be added to the channel 130. The method 900 includes adding the second power line in the channel automatically, as indicated at 916. The method 900 includes considering another macro, as indicated at 910. In a particular embodiment, the method 900 may be used to automatically consider substantially all macros in an integrated circuit.

Figure 10:
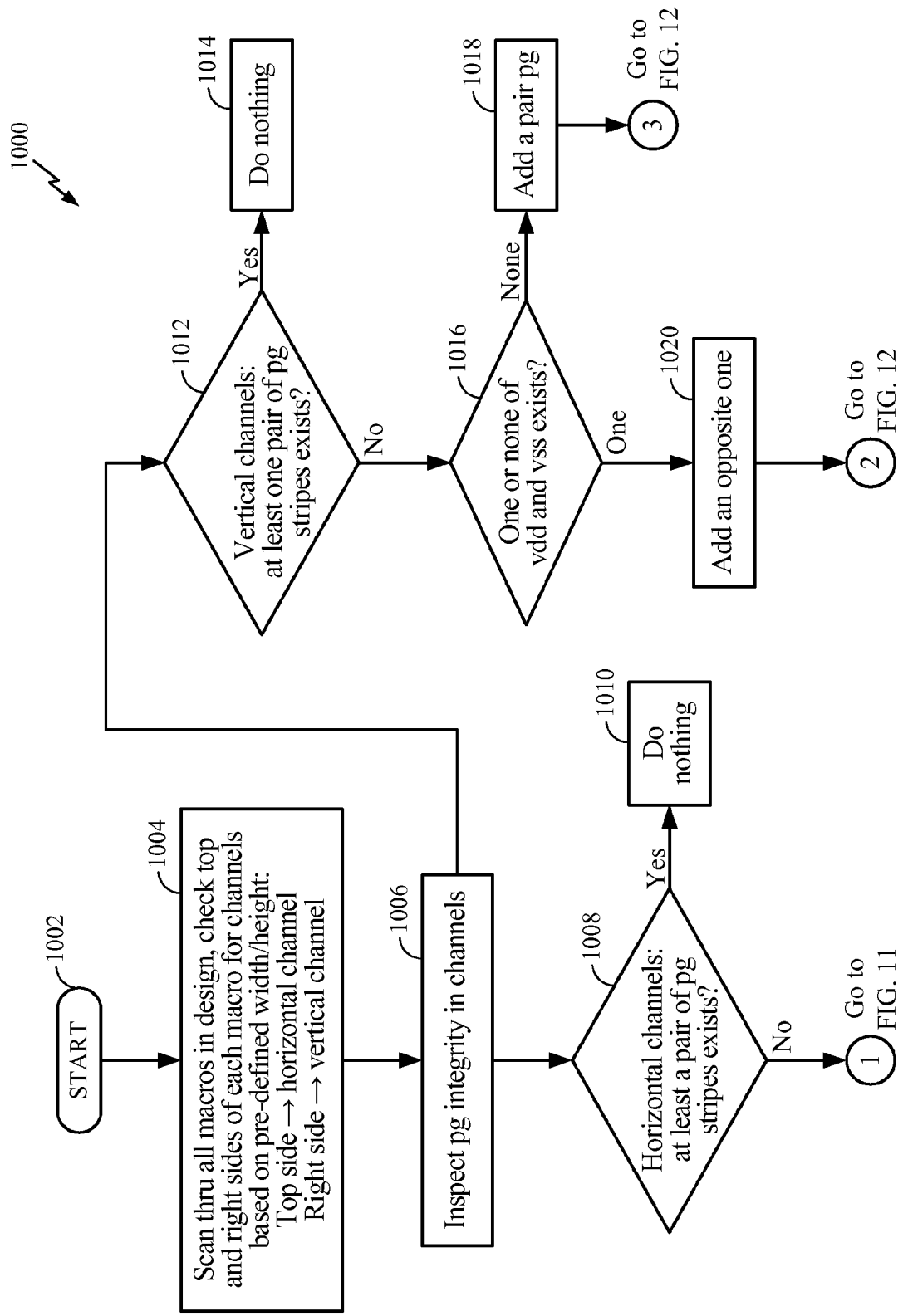
FIG. 10 is a flow diagram of another particular illustrative embodiment of a method to automatically add a power line in a channel.
Figure 11:
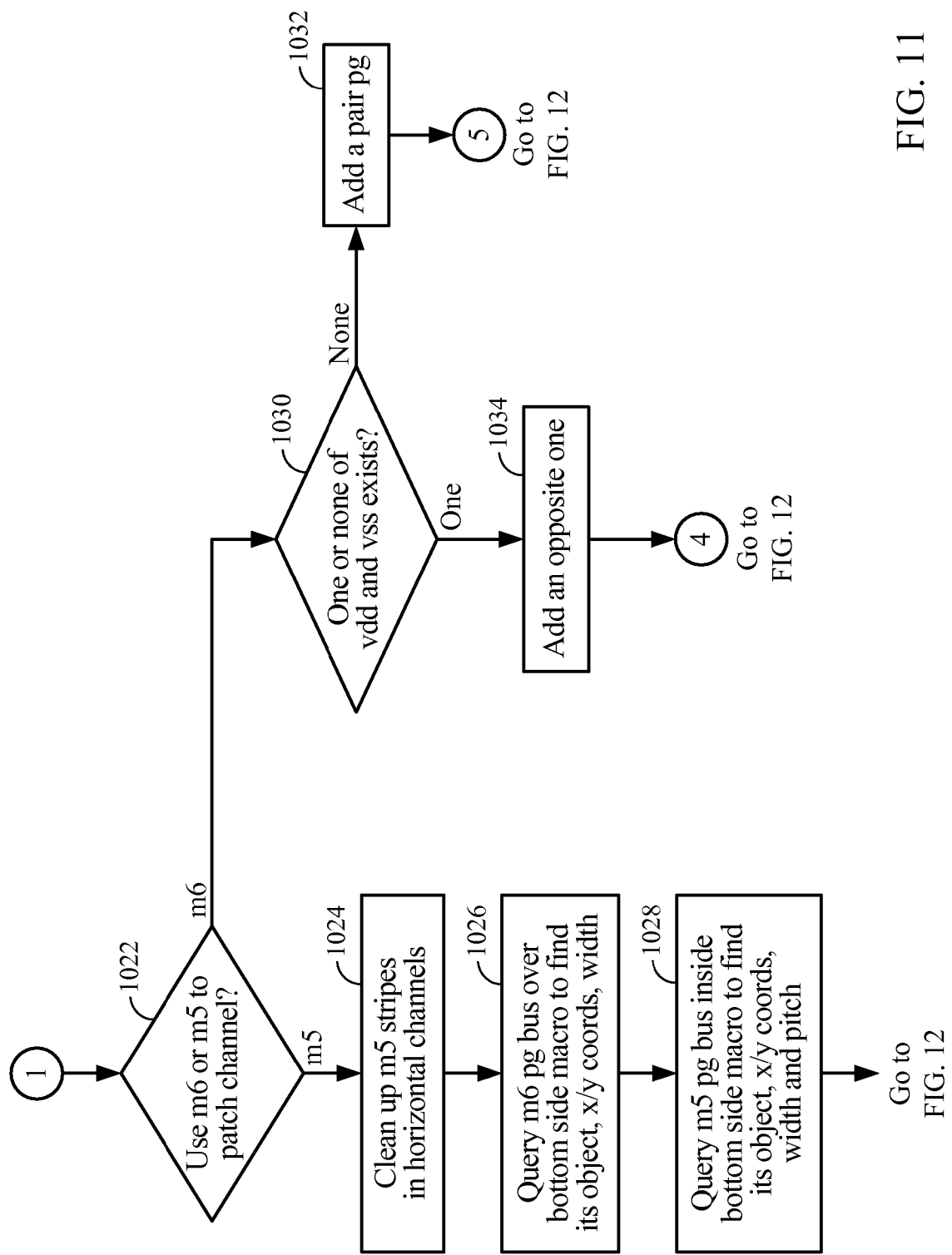
FIG. 11 is a continuation of the flow diagram of FIG. 10.
Figure 12:
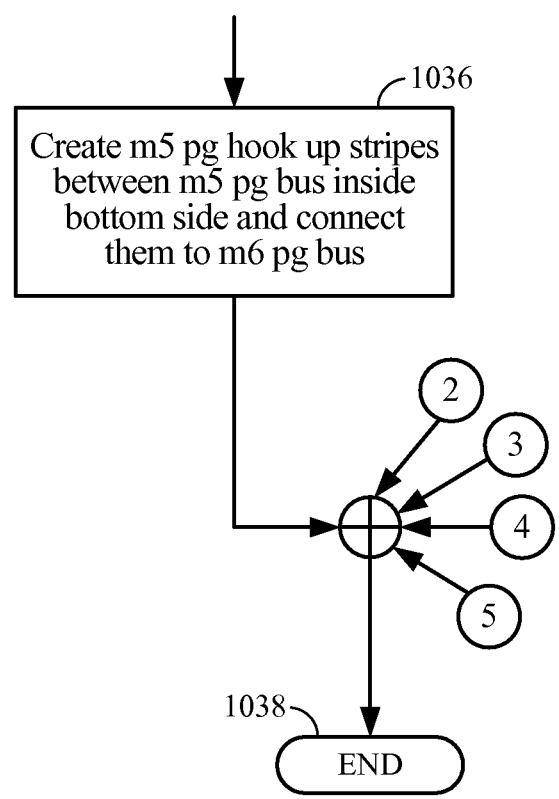
FIG. 12 is a continuation of the flow diagrams of FIG. 10 and FIG. 11.

Referring to FIGS. 10-12, a flow diagram of another particular illustrative embodiment of a method to automatically add a power line in a channel is depicted and generally designated 1000. The method 1000 starts, as indicated at 1002, and includes scanning through all macros in a circuit design, checking the top and right sides of each macro for channels based on pre-defined widths and heights, channels on the top side being horizontal channels and channels on the right side being vertical channels, as indicated at 1004. Channel heights correspond to horizontal channels, while channel widths correspond to vertical channels. The method 1000 includes inspecting the power/ground power grid integrity in the channels, as indicated at 1006.

The method 1000 includes determining for vertical channels if at least one pair of power/ground stripes (two power supply lines with opposite polarities) exists in the vertical channel, as indicated at 1012 (as in the particular illustrative embodiments shown in FIGS. 1-3). If at least one pair of power/ground stripes exists in the vertical channel, then nothing more is done with that channel and another channel is considered until all the channels have been considered, as indicated at 1014. If at least one pair of power/ground stripes does not exist in the vertical channel, then the method 1000 includes determining whether one or none of Vdd (power) and Vss (ground) exists in the vertical channel, as indicated at 1016. If neither Vdd nor Vss exists in the vertical channel, then a pair of power/ground stripes are added automatically in the vertical channel, as indicated at 1018 (as shown in FIG. 3), and then another channel is considered until all the channels have been considered, as indicated at 1038 in FIG. 12. If either Vdd or Vss exists in the vertical channel, then the opposite one (a power line with opposite polarity) is added automatically in the vertical channel, as indicated at 1020 (as shown in FIGS. 1-2), and then another channel is considered until all the channels have been considered, as indicated at 1038 in FIG. 12.

The method 1000 includes determining for horizontal channels if at least a pair of power/ground stripes exists in the horizontal channel, as indicated at 1008 (as in the particular illustrative embodiments shown in FIGS. 4A and 4B). If at least a pair of power/ground stripes exists in the horizontal channel, then nothing more is done with that channel and another channel is considered until all the channels have been considered, as indicated at 1010. Referring to FIG. 11, if at least a pair of power/ground stripes does not exist in the horizontal channel, then the method 1000 includes determining whether to use the M6 metal layer or the M5 metal layer to patch the horizontal channel, as indicated at 1022.

If the M6 metal layer is to be used, then the method 1000 includes determining whether one or none of Vdd and Vss exists in the horizontal channel, as indicated at 1030 (as shown in FIG. 4A). If neither Vdd nor Vss exists in the horizontal channel, then a pair of power/ground stripes are added automatically in the horizontal channel, as indicated at 1032, and then another channel is considered until all the channels have been considered, as indicated at 1038 in FIG. 12. If either Vdd or Vss exists in the horizontal channel, then the opposite one of Vdd or Vss is added automatically in the horizontal channel, as indicated at 1034, and then another channel is considered until all the channels have been considered, as indicated at 1038 in FIG. 12.

If the M5 metal layer is to be used (as shown in FIG. 4B), then the method 1000 includes cleaning up M5 metal layer stripes in the horizontal channel (if applicable), as indicated at 1024. The method 1000 includes querying the M6 metal layer power/ground bus over the bottom side macro to find the object, the x/y coordinates, and the width of the M6 metal layer power/ground bus, as indicated at 1026. The method 1000 includes querying the M5 metal layer power/ground bus inside the bottom side macro to find the object, the x/y coordinates, the width, and the pitch of the M5 metal layer power/ground bus, as indicated at 1028. Referring to FIG. 12, the method 1000 includes creating M5 metal layer power/ground hook-up stripes between the M5 power/ground bus inside the bottom side macro and connecting the M5 metal layer power/ground hook-up stripes to the M6 metal layer power/ground bus, as indicated at 1036. The M5 metal layer power/ground hook-up stripes may extend into the horizontal channel in a direction not parallel to the horizontal channel. The method 1000 includes considering another channel until all the channels have been considered, as indicated at 1038.

Figure 13:
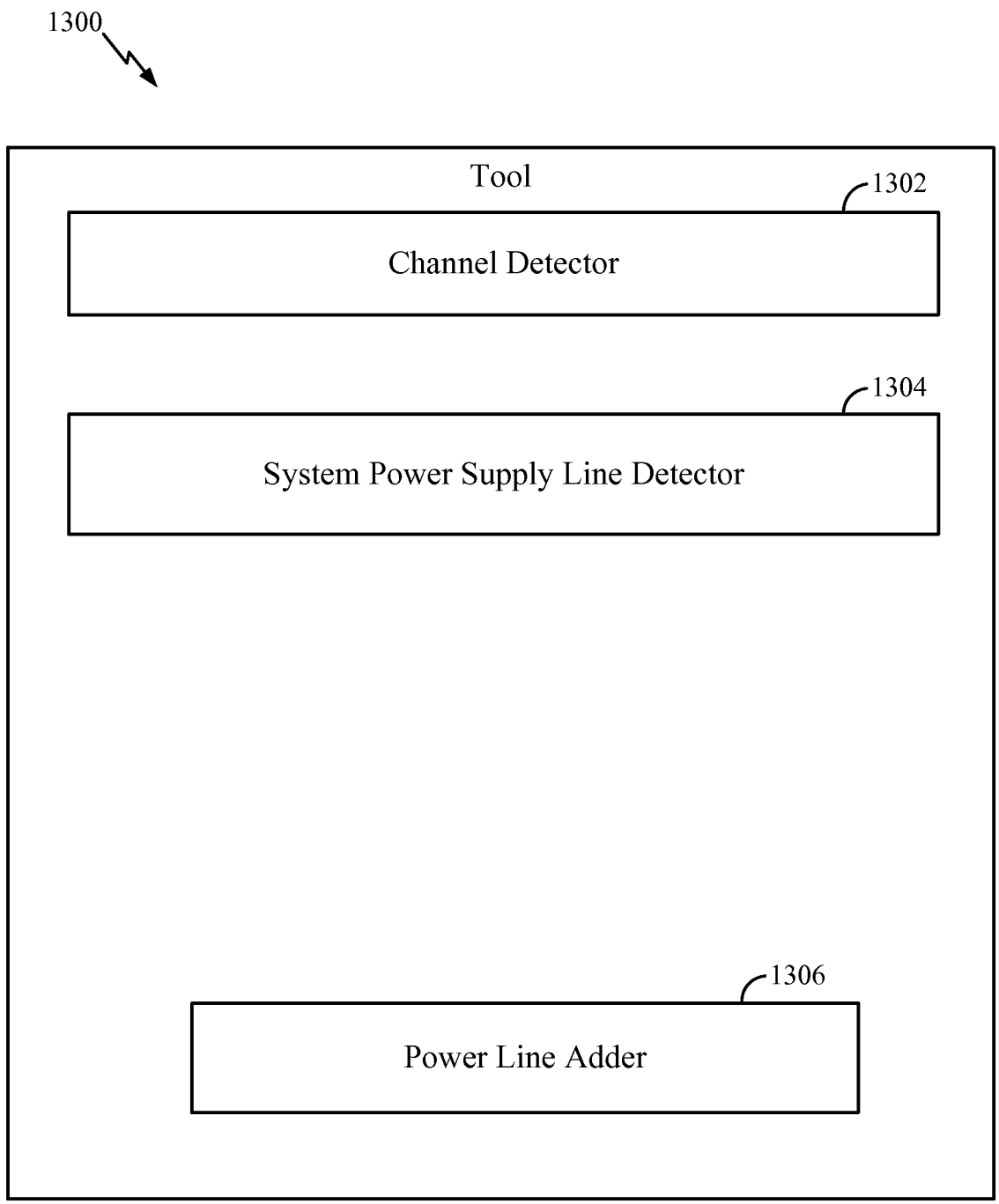
FIG. 13 is a diagram of a particular illustrative embodiment of an automated design tool to implement a method to automatically add a power line in a channel.

Referring to FIG. 13, a diagram of a particular illustrative embodiment of an automated circuit design tool to implement a method to automatically add a power line in a channel is depicted and generally designated 1300. The automated circuit design tool 1300 may include a processor-readable medium having processor instructions that are executable to cause a processor to: scan a circuit to detect channels 130 at a right side of a macro 110 (FIG. 1) and at a top of the macro 110 (FIG. 4A) in the circuit, determine the number of system power supply lines 150 and their polarities in the channels 130, and automatically add a power line 160 with proper polarity in at least one channel 130 where there are less than two system power supply lines 150 with opposite polarities. A suitable processor may be the processor 504 shown in FIG. 5, for example. In operation, the automated circuit design tool 1300 may effectively have a channel detector 1302 to scan a circuit to detect channels 130 at a right side of a macro 110 (FIG. 1) and at a top of the macro 110 (FIG. 4) in the circuit. The automated circuit design tool 1300 may also effectively have a system power supply line detector 1304 to determine the number of system power supply lines 150 and their polarities in the channels 130. The automated circuit design tool 1300 may also effectively have a power line adder 1306 to automatically add a power line 160 with proper polarity in at least one channel 130 where there are less than two system power supply lines 150 with opposite polarities.

In a particular embodiment, the processor executable instructions are further executable to add one or more additional devices between a first macro 110 and a second macro 120. In this particular embodiment, the additional devices between the first macro 110 and the second macro 120 may include decoupling capacitors, substrate well connectors, buffers, inverters, or any combination thereof, as shown by the device 200 in FIG. 2, for example.

In a particular embodiment, the processor executable instructions are further executable to determine whether the at least one channel is a vertical channel, as in FIG. 1, FIG. 2, and FIG. 3, or a horizontal channel, as in FIG. 4A and FIG. 4B, for example. Where the channel is a vertical channel, a first system power supply line disposed in a first upper metal layer of an integrated circuit, such as the M6 layer 724 shown in FIG. 7, may connect with a first added power line 160 (FIGS. 1-3) disposed in a lower metal layer of the integrated circuit, such as the M3 layer 712 shown in FIG. 7. Where the channel is a horizontal channel, a second system power supply line disposed in a second upper metal layer of an integrated circuit, such as the M6 layer 724 shown in FIG. 7, may connect with a second added power line 160 (FIG. 4A) disposed in a lower metal layer of the integrated circuit, such as the M3 layer 712 shown in FIG. 7. Alternatively, where the channel is a horizontal channel, a second system power supply line disposed in a second upper metal layer of an integrated circuit, such as the M6 layer 824 shown in FIG. 8, may connect with one or more second added power lines 460 (FIG. 4B) disposed in a lower metal layer of the integrated circuit, such as the M5 layer 820 shown in FIG. 8.

Figure 14:
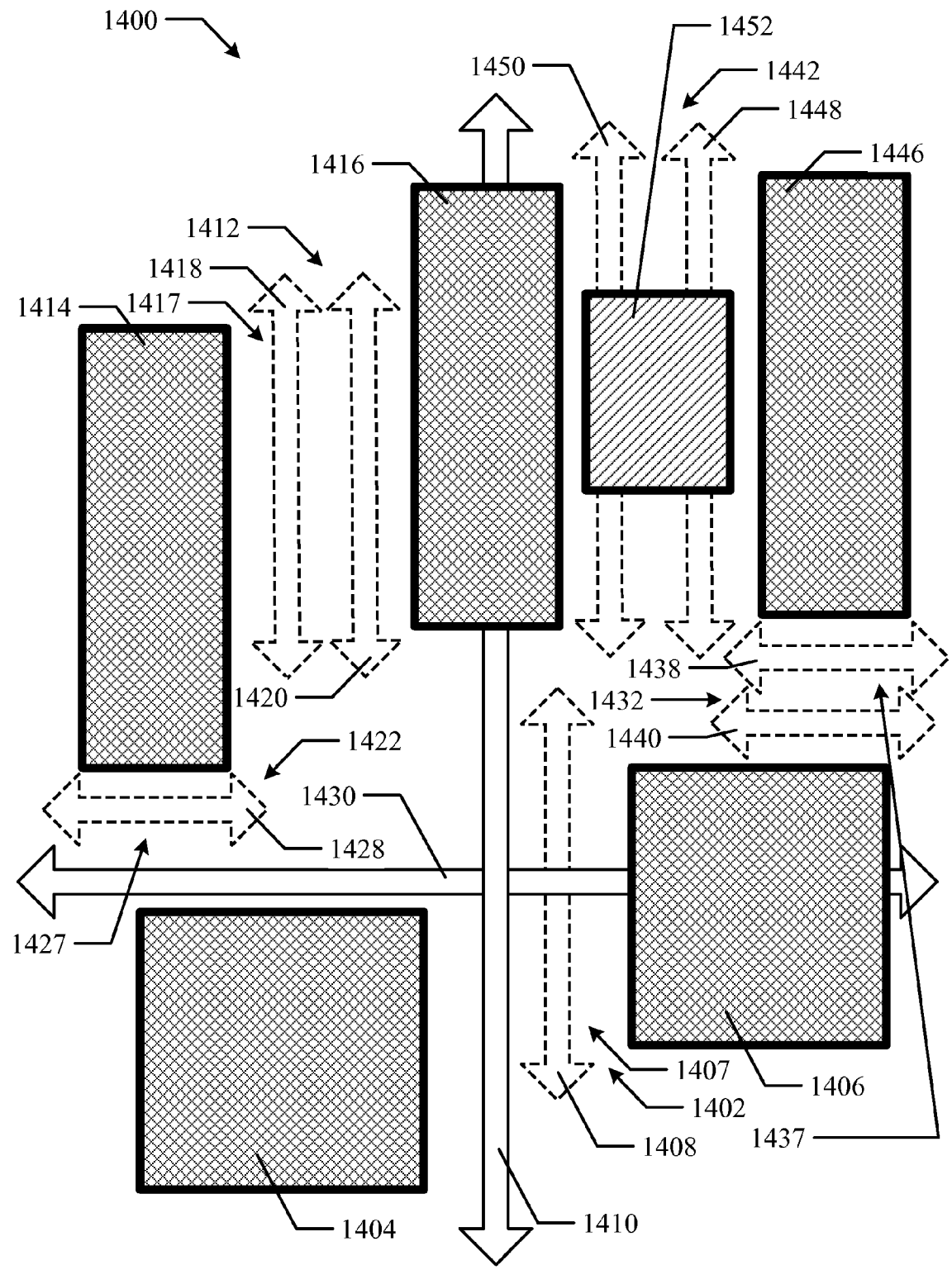
FIG. 14 is a diagram of a particular illustrative embodiment of a circuit designed using a method to automatically add a power line in a channel.

Referring to FIG. 14, a diagram of a particular illustrative embodiment of a circuit designed using a method to automatically add a power line in a channel is depicted and generally designated 1400. A computer-readable medium tangibly embodying computer-readable data may include a data file, such as the data file 518 shown in FIG. 5, which represents the circuit 1400 designed using an automated circuit design tool, such as the automated circuit design tool 1000 shown in FIG. 10.

The circuit 1400 may be designed using an automated circuit design tool. The circuit 1400 includes a first vertical channel 1402 between a first pair of macros 1404, 1406 with a first patch 1407 disposed in the first vertical channel 1402. The first patch includes at most one additional power line 1408 automatically added to the first vertical channel 1402. A first system power supply line 1410 is disposed in the first vertical channel 1402. The circuit 1400 includes a second vertical channel 1412 between a second pair of macros 1414, 1416 with a second patch 1417 disposed in the second vertical channel 1412. The second patch 1417 includes two additional power lines 1418, 1420 automatically added to the second vertical channel 1412. The circuit 1400 includes a first horizontal channel 1422 between a third pair of macros 1404, 1414 with a third patch 1427 disposed in the first horizontal channel 1422. The third patch 1427 includes at most one additional power line 1428 automatically added to the first horizontal channel 1422. A second system power supply line 1430 is disposed in the first horizontal channel 1422. The circuit 1400 includes a second horizontal channel 1432 between a fourth pair of macros 1406, 1446 with a fourth patch 1437 disposed in the second horizontal channel 1432. The fourth patch 1437 includes two additional power lines 1438, 1440 automatically added to the second horizontal channel 1432.

In a particular embodiment, the first patch 1407 and the second patch 1417 may connect a system power supply line disposed in an upper metal layer of an integrated circuit, such as the M6 layer 724 shown in FIG. 7, with at least one additional power line 1408, 1418 disposed in a lower metal layer of the integrated circuit, such as the M3 layer 712 shown in FIG. 7. In a particular embodiment, the third patch 1427 and the fourth patch 1437 may connect a system power supply line disposed in an upper metal layer of an integrated circuit, such as the M6 layer 724 shown in FIG. 7, with at least one additional power line 1428, 1438 disposed in a lower metal layer of the integrated circuit, such as the M3 layer 712 shown in FIG. 7.

The circuit 1400 may include at least one device 1452 coupled to the additional first power line 1448 in the channel 1442. In a particular embodiment, the at least one device 1452 may also be coupled to an additional second power line 1450 in the channel 1442. In a particular embodiment, the at least one device 1452 is a decoupling capacitor, a substrate well connector, a buffer, or an inverter.

Figure 15:
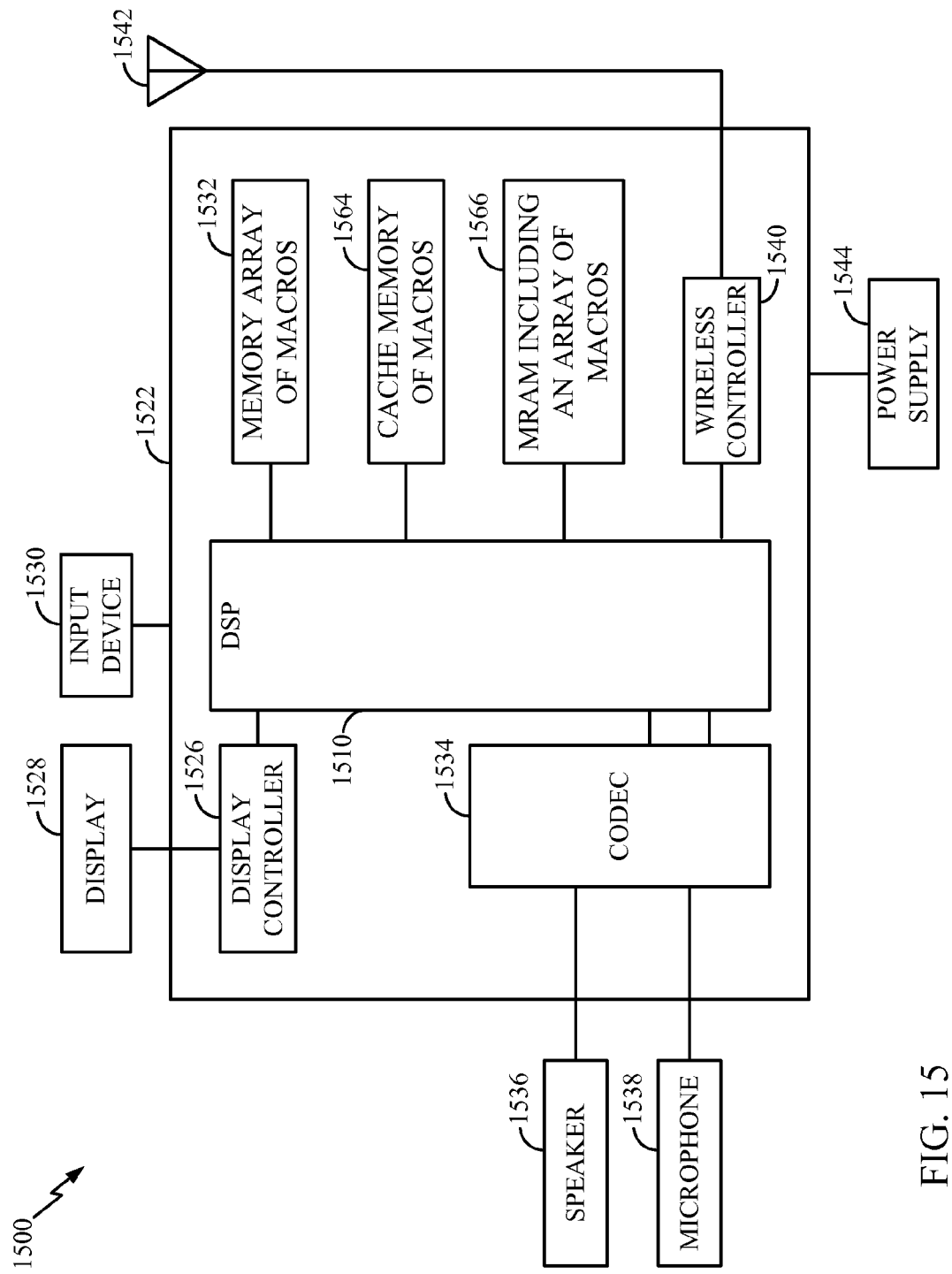
FIG. 15 is a block diagram of a communications device including devices and circuits designed using a method to automatically add a power line in a channel.

FIG. 15 is a block diagram of a communications device 1500 including a memory device that includes devices and circuits designed using a method to automatically add a power line in a channel. The communications device 1500 includes a memory array of macro cells 1532 and a cache memory of macro cells 1564, which are coupled to a processor, such as a digital signal processor (DSP) 1510. The communications device 1500 also includes a magneto-resistive random access memory (MRAM) device 1566 that is coupled to the DSP 1510. In a particular example, the memory array of macro cells 1532, the cache memory of macro cells 1564, and the MRAM device 1566 include multiple macro cells, with devices and circuits designed using a method to automatically add a power line in a channel, as described with respect to FIGS. 1-14.

FIG. 15 also shows a display controller 1526 that is coupled to the digital signal processor 1510 and to a display 1528. A coder/decoder (CODEC) 1534 can also be coupled to the digital signal processor 1510. A speaker 1536 and a microphone 1538 can be coupled to the CODEC 1534.

FIG. 15 also indicates that a wireless controller 1540 can be coupled to the digital signal processor 1510 and to a wireless antenna 1542. In a particular embodiment, an input device 1530 and a power supply 1544 are coupled to the on-chip system 1522. Moreover, in a particular embodiment, as illustrated in FIG. 15, the display 1528, the input device 1530, the speaker 1536, the microphone 1538, the wireless antenna 1542, and the power supply 1544 are external to the on-chip system 1522. However, each can be coupled to a component of the on-chip system 1522, such as an interface or a controller.

Those of skill would further appreciate that the various illustrative logical blocks, configurations, modules, circuits, and algorithm steps described in connection with the embodiments disclosed herein may be implemented as electronic hardware, computer software, or combinations of both. To clearly illustrate this interchangeability of hardware and software, various illustrative components, blocks, configurations, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disk read-only memory (CD-ROM), or any other form of storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable any person skilled in the art to make or use the disclosed embodiments. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope possible consistent with the principles and novel features as defined by the following claims.

What is claimed is:

1. A method comprising:
    determining, at a processor, whether less than two system power supply lines but at least one system power supply line having a first voltage level is detected within a channel between at least two macro cells of a circuit layout such that a shortest distance between the at least two macro cells satisfies a threshold value, wherein each power supply line is coupled to provide power to a device within the channel to reduce signal delay between a first macro cell and a second macro cell, and wherein the device is coupled to the first macro cell and to the second macro cell; and
    automatically adding a power line having a second voltage level to the circuit layout in the channel between the at least two macro cells in response to a determination that the at least one system power supply line is detected within the channel, wherein the second voltage level has an opposite polarity to the first voltage level, and wherein the added power line is coupled to provide power to the device within the channel.

2. The method of claim 1, further comprising:
    coupling the added power line to the device within the channel.

3. The method of claim 1, wherein the device is one of a decoupling capacitor to reduce power grid noise, a substrate well connector to prevent a latch-up violation, a buffer to reduce a propagation delay of signals in the channel, or an inverter to reduce a propagation delay of signals in the channel.

4. The method of claim 1, wherein the at least two macro cells includes the first macro cell and the second macro cell.

5. The method of claim 1, further comprising depositing at least one metal layer within the channel.

6. The method of claim 1, further comprising:
    automatically adding a pair of power lines to the circuit layout in the channel between the at least two macro cells in response to a determination that the at least one system power supply line is not detected within the channel, wherein a first power line of the added pair of power lines has a first voltage level that has a polarity that is opposite to a second voltage level of a second power line of the added pair of power lines, and wherein the added pair of power lines are coupled to provide power to the device within the channel.

7. The method of claim 1, wherein the added power line connects to a system power supply line outside the channel, the added power line extending in a direction not parallel to the channel.

8. The method of claim 1, further comprising:
    identifying the channel between the at least two macro cells based on a determination that the shortest distance between the at least two macro cells satisfies the threshold value.

9. An automated circuit design tool comprising a non-transitory processor-readable medium having processor-executable instructions that are executable to cause a processor to:
    scan a circuit layout to detect channels at a right side of a macro cell in the circuit layout and at a top of the macro cell in the circuit layout wherein a channel is detected when a shortest distance between the macro cell and another macro cell satisfies a threshold value;
    determine a number of system power supply lines in the channels and a voltage level of each of the system power supply lines, wherein each system power supply line is coupled to provide power to devices within the channels; and
    automatically add a single power line having a second voltage level in a particular channel in response to a determination that there is one system power supply line in the particular channel, wherein the one system power supply line has a first voltage level that has an opposite polarity to the second voltage level, wherein the single power line is coupled to provide power to at least one device within the particular channel, and wherein the at least one device is coupled to at least one of a macro cell or signals propagating through the particular channel.

10. The automated circuit design tool of claim 9, wherein the processor-executable instructions are further executable to cause the processor to:
    add the at least one device in the particular channel.

11. The automated circuit design tool of claim 9, wherein the at least one device includes one of a decoupling capacitor to reduce power grid noise, a substrate well connector to prevent a latch-up violation, a buffer to reduce a propagation delay of signals in the particular channel, or an inverter to reduce a propagation delay of signals in the particular channel.

12. The automated circuit design tool of claim 9, wherein the processor-executable instructions are further executable to cause the processor to:
    determine whether the particular channel is a vertical channel or a horizontal channel.

13. The automated circuit design tool of claim 12, wherein a first system power supply line disposed in a first metal layer of an integrated circuit connects with the added single power line, wherein a second system power supply line disposed in a second metal layer of an integrated circuit connects with the one system power supply line, and wherein the single power line and the one system power supply line are disposed in a metal layer of the integrated circuit that is different than the first metal layer and the second metal layer.

14. The automated circuit design tool of claim 9, wherein the processor-executable instructions are further executable to cause the processor to automatically add a pair of power lines in the particular channel in response to a determination that there are no system power supply lines detected within the particular channel, wherein a first power line of the added pair of power lines has a first voltage level, and wherein a second power line of the added pair of power lines has a second voltage level that has an opposite polarity to the first voltage level, wherein the pair of power lines are coupled to provide power to the at least one device.

15. A non-transitory computer-readable medium embodying computer-readable data comprising a data file that represents a circuit designed using an automated circuit design tool, the circuit comprising:
  a first channel between at least two macro cells disposed in the circuit such that a shortest distance between the at least two macro cells satisfies a threshold value; and
  a first power line, wherein an automated circuit design tool automatically added the first power line in the first channel in response to a determination that less than two system power supply lines coupled to provide power to a device within the first channel but at least one system power supply line having a first voltage level is disposed within the first channel, wherein the first power line is coupled to provide power to the device within the first channel, and wherein the device is coupled to at least one of a macro cell or signals propagating through the first channel.

16. The non-transitory computer-readable medium of claim 15, wherein the circuit further comprises:
  a second channel; and
  a pair of power lines within the second channel, wherein the automated circuit design tool automatically added the pair of power lines in the second channel in response to a determination that no system power supply lines are within the second channel, and wherein the pair of power lines are coupled to provide power to a second device within the second channel.

17. The non-transitory computer-readable medium of claim 15, wherein the device is one of a decoupling capacitor to reduce power grid noise, a substrate well connector to prevent a latch-up violation, a buffer to reduce a propagation delay of signals in the first channel, or an inverter to reduce a propagation delay of signals in the first channel.

18. An apparatus comprising:
  means for determining, at a processor, whether less than two system power supply lines but at least one system power supply line having a first voltage level is detected within a channel between at least two macro cells of a circuit layout such that a shortest distance between the at least two macro cells satisfies a threshold value, wherein each power supply line is coupled to provide power to a device within the channel, and wherein the device is coupled to at least one of a macro cell or signals propagating through the channel; and
  means for automatically adding a power line having a second voltage level to the circuit layout in the channel between the at least two macro cells in response to a determination that less than two system power supply lines but the at least one system power supply line is detected within the channel, wherein the second voltage level has an opposite polarity to the first voltage level, and wherein the added power line is coupled to provide power to the device.

19. The apparatus of claim 18, further comprising means for coupling the added power line to the device within the channel.

20. The apparatus of claim 18, wherein the device is one of a decoupling capacitor to reduce power grid noise, a substrate well connector to prevent a latch-up violation, a buffer to reduce a propagation delay of signals in the channel, or an inverter to reduce a propagation delay of signals in the channel.

21. The apparatus of claim 18, further comprising means for depositing at least one metal layer within the channel.

22. A non-transitory processor-readable medium comprising processor-executable instructions that are executable to cause a processor to:
  determine whether less than two system power supply lines but at least one system power supply line having a first voltage level is detected within a channel that is between at least two macro cells of a circuit such that a shortest distance between the at least two macro cells satisfies a threshold value layout, wherein each power supply line is coupled to provide power to a device within the channel, and wherein the device is coupled to at least one of a macro cell or signals propagating through the channel; and
  automatically add a power line having a second voltage level to the circuit layout in the channel between the at least two macro cells in response to a determination that less than two system power supply lines but the at least one system power supply line is detected within the channel, wherein the second voltage level has an opposite polarity to the first voltage level, and wherein the added power line is coupled to provide power to the device.

23. The non-transitory processor-readable medium of claim 22, further comprising processor-executable instructions that are executable to cause the processor to couple the added power line to the device within the channel.

24. The non-transitory processor-readable medium of claim 22, wherein the device is one of a decoupling capacitor to reduce power grid noise, a substrate well connector to prevent a latch-up violation, a buffer to reduce a propagation delay of signals in the channel, or an inverter to reduce a propagation delay of signals in the channel.

25. The non-transitory processor-readable medium of claim 22, further comprising processor-executable instructions that are executable to cause the processor to deposit at least one metal layer within the channel.

26. A method comprising:
  determining, at a processor, whether less than two system power supply lines but at least one system power supply line having a first voltage level is detected within a channel between at least two macro cells of a circuit layout such that a shortest distance between the at least two macro cells satisfies a threshold value, wherein each power supply line is coupled to provide power to a device within the channel, and wherein the device is coupled to at least one of a macro cell or signals propagating through the channel; and
  automatically adding a power line having a second voltage level to the circuit layout in the channel between the at least two macro cells in response to a determination that the at least one system power supply line is detected within the channel, wherein the second voltage level has an opposite polarity to the first voltage level, and wherein the added power line is coupled to provide power to the device within the channel.

27. The method of claim 26, wherein the device is one of a decoupling capacitor to reduce power grid noise, a substrate well connector to prevent a latch-up violation, a buffer to reduce a propagation delay of signals in the channel, or an inverter to reduce a propagation delay of signals in the channel.

* * * * *